United States Patent
Schulze et al.

(10) Patent No.: US 10,411,097 B2
(45) Date of Patent: Sep. 10, 2019

(54) SEMICONDUCTOR COMPONENT HAVING A DOPED SUBSTRATE LAYER AND CORRESPONDING METHODS OF MANUFACTURING

(71) Applicant: Infineon Technologies AG, Neubiberg (DE)

(72) Inventors: Hans-Joachim Schulze, Taufkirchen (DE); Jens Peter Konrath, Villach (AT); Roland Rupp, Lauf (DE); Christian Hecht, Buckenhof (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/868,619

(22) Filed: Jan. 11, 2018

(65) Prior Publication Data
US 2018/0158916 A1   Jun. 7, 2018

Related U.S. Application Data

(63) Continuation of application No. 14/306,071, filed on Jun. 16, 2014.

(51) Int. Cl.
*H01L 29/16*   (2006.01)
*H01L 21/04*   (2006.01)
(Continued)

(52) U.S. Cl.
CPC ...... *H01L 29/1608* (2013.01); *H01L 21/0465* (2013.01); *H01L 21/26506* (2013.01);
(Continued)

(58) Field of Classification Search
CPC .......... H01L 21/2007; H01L 21/76254; H01L 29/66666; H01L 29/732; H01L 29/7395; H01L 29/7827
See application file for complete search history.

(56) References Cited

U.S. PATENT DOCUMENTS 6,291,313 B1   9/2001   Henley et al.
6,562,187 B2   5/2003   Winniczek et al.
(Continued)

FOREIGN PATENT DOCUMENTS

JP   H077154 A   1/1995
JP   2002368216 A   12/2002
(Continued)

OTHER PUBLICATIONS

Machine Translation of JP 2013-118247 A.*
(Continued)

*Primary Examiner* — Bryan R Junge
(74) *Attorney, Agent, or Firm* — Murphy, Bilak & Homiller, PLLC (57) ABSTRACT

Representative implementations of devices and techniques provide an optimized layer for a semiconductor component. In an example, a doped portion of a wafer, forming a substrate layer may be transferred from the wafer to an acceptor, or handle wafer. A component layer may be applied to the substrate layer. The acceptor wafer is detached from the substrate layer. In some examples, further processing may be executed with regard to the substrate and/or component layers.

11 Claims, 6 Drawing Sheets

(51) Int. Cl.
*H01L 21/265* (2006.01)
*H01L 21/762* (2006.01)
*H01L 29/739* (2006.01)
*H01L 29/78* (2006.01)

(52) U.S. Cl.
CPC ...... *H01L 21/762* (2013.01); *H01L 21/76254* (2013.01); *H01L 29/7395* (2013.01); *H01L 29/7827* (2013.01)

(56) References Cited

U.S. PATENT DOCUMENTS

| | | | |
|---|---|---|---|
| 2008/0203471 A1* | 8/2008 | Otake | H01L 29/32 257/329 |
| 2008/0296771 A1 | 12/2008 | Das et al. | |
| 2009/0134405 A1 | 5/2009 | Ota et al. | |
| 2009/0315071 A1 | 12/2009 | Iwabuchi et al. | |
| 2011/0204414 A1 | 8/2011 | Kopta et al. | |
| 2012/0129301 A1 | 5/2012 | Or-Bach et al. | |
| 2012/0142173 A1* | 6/2012 | Watanabe | H01L 21/02378 438/504 |
| 2012/0181550 A1 | 7/2012 | Fujibayashi et al. | |
| 2012/0289003 A1 | 11/2012 | Hirler et al. | |
| 2013/0009171 A1* | 1/2013 | Harada | H01L 21/02002 257/77 |
| 2013/0134478 A1 | 5/2013 | Nakajima et al. | |
| 2013/0221377 A1* | 8/2013 | Ward | C30B 25/183 257/77 |
| 2013/0234201 A1* | 9/2013 | Xiao | H01L 29/7393 257/139 |
| 2014/0252378 A1 | 9/2014 | Ota et al. | |
| 2014/0327118 A1* | 11/2014 | Chang | H01L 29/66333 257/653 |

FOREIGN PATENT DOCUMENTS

| | | |
|---|---|---|
| JP | 2010157546 A | 7/2010 |
| JP | 2011254087 A | 12/2011 |
| JP | 2012146695 A | 8/2012 |
| JP | 2012151177 A | 8/2012 |
| JP | 2013118247 A | 6/2013 |
| WO | 2014080874 A1 | 5/2014 |

OTHER PUBLICATIONS

Hideki, "Silicon Carbide Semiconductor Device Manufacturing Method", JP 2013118247 A, Sumitomo Electric Industries, English Translation, Jun. 13, 2013, pp. 1-11.

* cited by examiner

SEMICONDUCTOR COMPONENT HAVING A DOPED SUBSTRATE LAYER AND CORRESPONDING METHODS OF MANUFACTURING

BACKGROUND

Developments in semiconductor technologies include the use of materials such as silicon carbide (SiC) in the production of fast, high-temperature, high-voltage capacity semiconductor devices. In many cases, n-type SiC substrates used in the production of SiC devices are obtained by sawing off portions from bulk crystals, then sanding, polishing, and so forth. This can be a difficult and expensive process. Often the substrates have inhomogeneous doping characteristics, and may be limited to a doping concentration at or below $10^{19}$ cm$^3$. Higher doping concentrations can lead to mechanical instabilities of the SiC wafer (e.g., warping or spontaneous cracking in high-temperature process steps or mechanical stresses).

Generally, there are similar issues regarding the production of p-type substrates. Additionally, there may be difficulties growing sufficiently large p-type crystals in the desired doping concentration, due to depletion of the p-type dopant (e.g., aluminum) during manufacturing, for example. This can make it problematic to produce, for example, n-channel insulated-gate bipolar transistors (IGBT), and the like.

In some cases, desired devices may be manufactured by growing a thick n-type drift layer on a substrate, and then grinding away the substrate afterwards. A highly doped p-type layer may be formed on one surface of the drift layer, by epitaxy for example. This process may be successful if the drift layer is stable enough for handling after grinding away the substrate (e.g., if the thickness of the drift layer remains at least 100 microns or greater). Thus, the mechanical stability of the drift layer may be a limiting factor for the production of devices using this process. Further, this process can be difficult and expensive, particularly if a SiC substrate is used to grow the drift layer, and is ground away afterwards.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide an optimized starting layer for a semiconductor component, such as a silicon carbide (SiC) semiconductor component. In an example, a wafer, such as a SiC wafer, may be doped to a desired concentration to form a starting layer (i.e., substrate layer). The doping properties of the starting layer may be "tuned" to form the optimized starting layer for the semiconductor component. In various implementations, the tuning may comprise one or more processes, which may be performed either before or after transferring the substrate layer to an acceptor wafer for forming the semiconductor component.

In one implementation, the wafer is uniformly doped over the area of the wafer, to form a homogeneously doped substrate wafer. In another implementation, the wafer is doped in a pattern to form a substrate layer having alternating doping. In various implementations, the wafer may be masked, implanted, and/or trenched to form a doped pattern on the wafer. For example, the masked areas or trenches may be partially or fully filled using an implantation or epitaxy process to form portions having an opposite type of doping.

In an implementation, the substrate layer is transferred from the wafer to an acceptor, or handle wafer, for processing, for instance. In various implementations, the substrate layer is cut from the wafer using ion implantation and in particular hydrogen implantation, or the like. The substrate layer may be bonded to the acceptor wafer using various bonding techniques.

In an implementation, a component layer is applied to a surface of the substrate layer, using epitaxial Techniques for instance. In various examples, the component layer may be processed, including being doped, having metallization added, and the like. In an implementation, the acceptor wafer is detached from the substrate layer. In some examples, further processing may be executed with regard to the substrate and/or component layers to form a completed semiconductor device.

Various implementations and arrangements are discussed with reference to electrical and electronics components and varied materials. While specific materials (i.e., silicon carbide (SiC), etc.) are mentioned, this is not intended to be limiting, and is for ease of discussion and illustrative convenience. The techniques and devices discussed with reference to SiC are applicable to any type of semiconductor materials, such as silicon, other "wide band-gap materials," or the like. Accordingly, the use of "SiC" in the disclosure is intended to also apply to these other materials.

Figure 1:
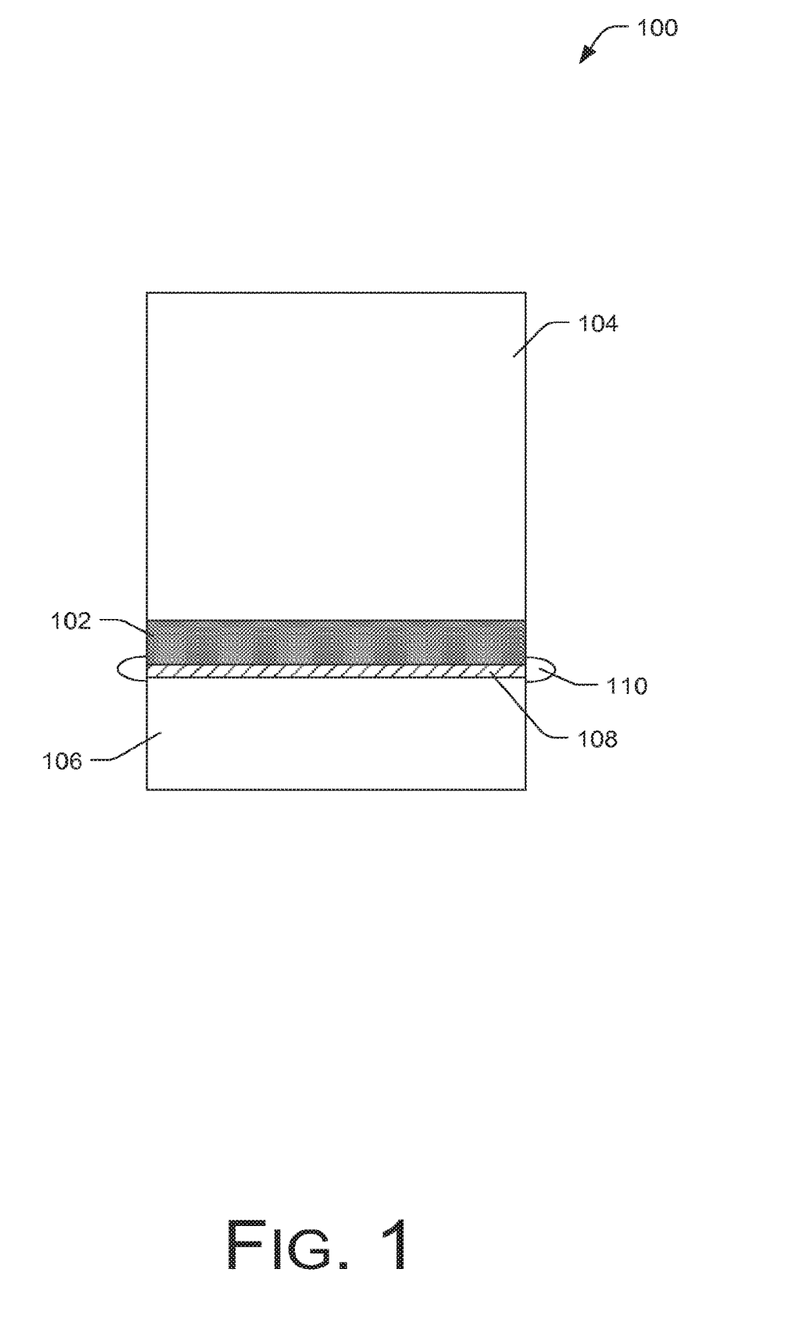
FIG. 1 is a cross-sectional profile view of a homogeneously doped starting layer for semiconductor epitaxy, according to an example.

Implementations are explained in more detail below using a plurality of examples. Although various implementations and examples are discussed here and below, further implementations and examples may be possible by combining the features and elements of individual implementations and examples.

Example Arrangement FIG. 1 is a cross-sectional profile view of a semiconductor arrangement 100 including a starting layer (e.g., carrier, substrate, etc.) 102 for constructing a semiconductor component, according to an example. The arrangement 100 represents an example environment whereby the techniques and devices discussed herein may be applied. For instance, a semiconductor component may be formed by adding to the starting layer 102, epitaxial layers and in particular in combination with implantation techniques and suitable high-temperature processes for annealing and in-diffusion of the dopants for example.

The techniques, components, and devices described herein with respect to the semiconductor arrangement 100 are not limited to the illustrations in FIGS. 1-5, and may be applied to other designs, types, arrangements, and constructions without departing from the scope of the disclosure. In some cases, alternative components or materials may be used to implement the techniques described herein. In various implementations, the arrangement 100 may be stand-alone, or it may be a portion of a system, component, structure, or the like.

The illustration of FIG. 1 shows an example configuration of the starting layer 102, in relation to other portions of the semiconductor arrangement 100, according to one implementation. In various implementations, other configurations, designs, and the like, may also be used for the semiconductor arrangement 100.

In an implementation, as shown in FIG. 1, the semiconductor arrangement 100 includes a substrate layer (i.e., structured starting layer) 102 and a component layer 104. In one implementation, the substrate layer 102 comprises a high doping density relative to a much lower doping density of the component layer 104. The doping density of the layer 104 is for example in the range of $10^{14}/cm^3$-$10^{17}/cm^3$, more typically in the range $5*10^{14}$ $cm^3$-$10^{16}/cm^3$. The layer 102 has a doping density of $10^8/cm^3$-$10^{20}/cm^3$, more typically $10^{19}/cm^3$-$5*10^{19}/cm$. Further, in various implementations, the thickness of the substrate layer 102 may be substantially less than the thickness of the component layer 104. The thickness of the layer 104 is for example in the range of 20 μm-200 μm, more typically in the range of 50 μm-100 μm. The layer 102 has a thickness of 5 μm-20 μm, more typically 5 μm-10 μm.

In an implementation, the substrate layer 102 is formed by doping a SiC wafer, for example, at a desired doping density. In one implementation, the substrate layer 102 comprises a highly doped p-type substrate. In an alternate implementation, the substrate layer 102 comprises a highly doped n-type substrate.

In various implementations, one or more doping properties of the substrate layer 102 are tuned based on a type of the semiconductor component to be formed on the substrate layer 102. For example, the doping properties or characteristics may be deliberately tuned to be optimized for forming a desired device. In some implementations, in the case of high n-type doping, the substrate layer 102 may be tuned to form a low ohmic drain contact for power MOSFETs, for example, as a rear-side contact zone for Schottky diodes, bipolar diodes or power MOSFETs, or as an emitter for a bipolar junction transistor (BJT). In the case of a p-type doping, the substrate layer 102 may be optimized to serve as a rear emitter (e.g., for an bipolar transistor, insulated-gate bipolar transistor (IGBT), or thyristor etc.) or as a drain region or a contact zone for power MOSFETs with a p-doped drift region, or the like.

In various implementations, as shown in FIG. 1, the substrate layer 102 is homogeneously doped using epitaxy or implantation. In one implementation, the substrate layer 102 is homogeneously doped at a doping concentration of $10^{20}$ $cm^{-3}$, or greater. In other words, the substrate layer 102 is tuned and has a uniform, high-density doping.

In another implementation, the substrate layer 102 may be tuned to include adjacent p-type and n-type doping. For example, the substrate layer 102 may be comprised of a first portion having an n-type doping and an adjacent second portion having a p-type doping. In other words, the substrate layer 102 may be composed of adjacent portions with opposite types (n-type and p-type) of doping. This may be advantageous in the formation of various semiconductor devices, for example.

Figure 2:
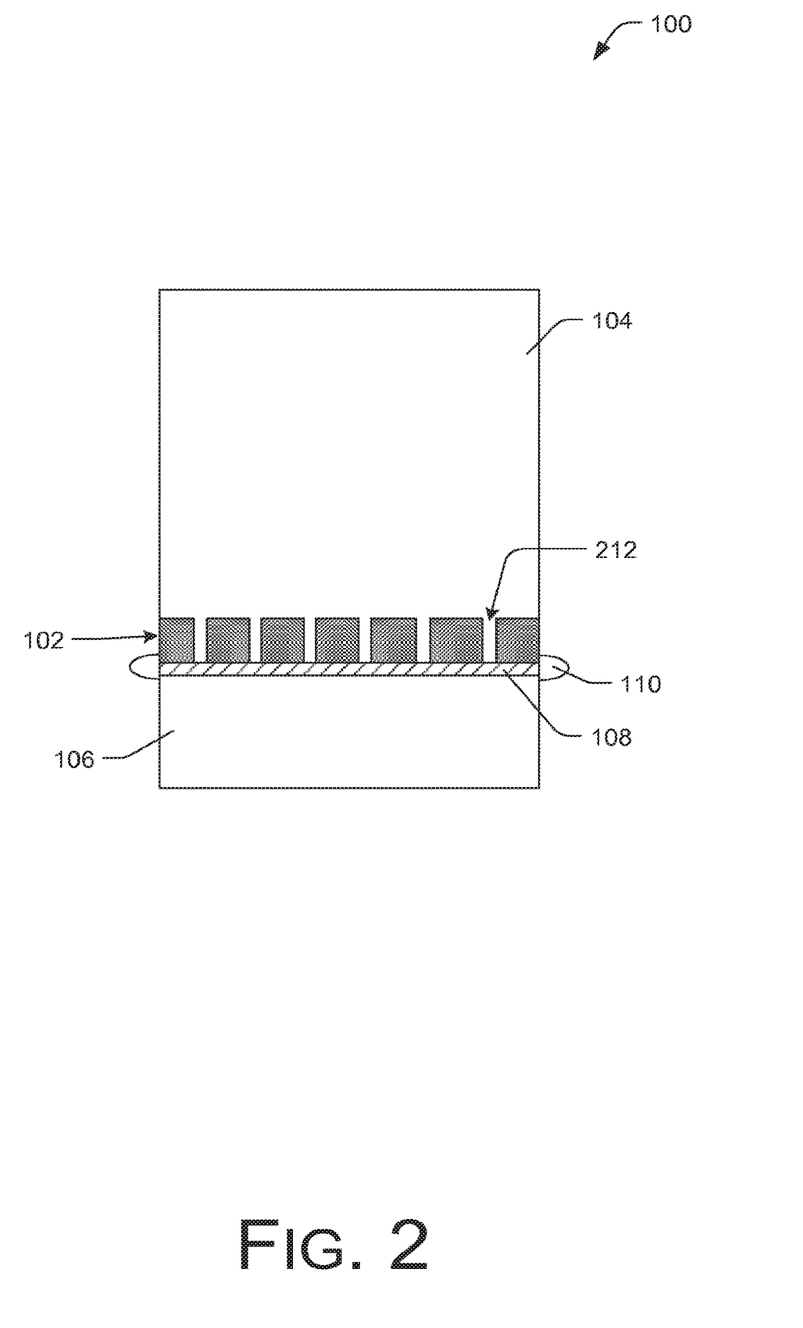
FIG. 2 is a cross-sectional profile view of a structured starting layer for semiconductor epitaxy, according to another example.

In one example implementation (as shown in FIG. 2), the substrate layer 102 layer is comprised of a plurality of laterally oriented portions alternately having an n-type doping and a p-type doping. In various implementations, the alternating doping pattern may be formed using a masked implantation in combination with subsequent annealing or diffusion steps at high process temperatures, a trench fill epitaxy, or the like. In example implementations, a substrate layer 102 having alternating doping can serve as a local emitter structure, for instance, without extensive additional processing to the backside surface of the substrate layer 102.

In various implementations, after tuned doping, the substrate layer 102 is removed from the bulk SiC wafer, and is transferred to an acceptor wafer (e.g., handle wafer, carrier, etc.) 106. In one example, the substrate layer 102 is removed using ion implantation, or the like. For instance, the bulk SiC wafer may be implanted with hydrogen ions at a uniform desired depth, and thermally treated. The uniform desired depth represents the desired thickness of the substrate layer 102. The substrate layer 102 is then cleaved or cut from the SiC wafer at the depth of the ion implantation.

Once removed from the SiC wafer, the substrate layer 102 is transferred and may be bonded to the acceptor wafer 106 for semiconductor component processing. In one implementation, the substrate layer 102 is bonded to the acceptor wafer 106 using an oxidic bonding process, or the like. In various implementations, the acceptor wafer 106 is comprised of a material that is compatible with a SiC epitaxial process (e.g., tungsten, poly-silicon carbide, SiC coated carbon, etc.). For example, the acceptor wafer 106 may be comprised of a material capable of withstanding a hydrogen atmosphere, and a temperature of 1500-1600 C, or the like. In other implementations, the acceptor wafer 106 is comprised of a material that is compatible with an epitaxial process (or other formation process) of an alternate material (silicon, etc.) of the substrate layer 102.

In an implementation, the substrate layer 102 includes an insulating layer 108 on the surface of the substrate layer 102 that is bonded to the acceptor wafer 106. This insulating layer 108 may be formed by oxidation, for example, on the surface of the substrate layer 102 prior to transferring the substrate layer 102 to the acceptor wafer. For example, the insulating layer 108 may be comprised of silicon dioxide ($SiO_2$) or the like.

In various implementations, the insulating layer 108 is located between the substrate layer 102 and the acceptor wafer 106, and insulates the substrate layer 102 from the acceptor wafer 106 during the manufacturing process. In various implementations, as shown in FIG. 1, the semiconductor arrangement 100 may also include a protection layer 110. In one example, the protection layer 110 protects the oxide insulating layer 108 during the epitaxial process. For example, based on the atmospheric conditions of the epitaxial process, the oxide insulating layer 108 can be dissolved without the protection of the protection layer 110. In some implementations, the protection layer 110 is a sacrificial layer, being dissolved in the epitaxial process instead of the oxide insulating layer 108.

In an alternate implementation, a thin layer of the bulk SiC wafer may be transferred to the acceptor wafer 106 prior to doping (e.g., implantation, epitaxy, etc.) to form the substrate layer 102. In the implementation, the thin layer of the bulk SiC wafer may be cut from the bulk SiC wafer using ion implantation, or the like, as described above. After transferring the thin layer to the acceptor wafer 106, the thin layer may be uniformly doped over the surface of the thin layer, or it may be doped in an alternating doping pattern, with a high doping density in either case. Additionally or alternatively, the thin layer may be trench etched, epitaxially filled, implanted, or the like, to form the substrate layer 102.

In an alternate implementation the bonding process of the hydrogen-implanted substrate layer to the acceptor wafer takes place prior to the annealing step which induces the separation of the layer 102 from the rest of the substrate layer.

In various implementations, the component layer 104 is formed (e.g., by epitaxy, implantation, etc.) on a surface of the substrate layer 102 after the substrate layer 102 is bonded to the acceptor wafer 106. As described above, in the implementations, the component layer 104 may be doped at a lesser density than the substrate layer 102, may be thicker than the substrate layer 102, and/or may have a greater impedance than the substrate layer 102.

In an implementation, the component layer 104 is comprised of a lighter doped SiC layer. The component layer 104 may be grown on the surface of the substrate layer 102 after the substrate layer 102 has been processed (e.g., implanted, annealed, trenched, epitaxially filled, etc.) as described further below. Once the component layer 104 is formed, the component layer 104 may be processed also, including implantation, etching, filling, metallization, edge passivation, and the like, to form a desired semiconductor component.

In various implementations, the acceptor wafer 106 and the insulating layer(s) 108, 110 are detached (i.e., removed) from the substrate layer 102 to form the semiconductor component. In an example, the acceptor wafer 106 is used for handling the substrate layer 102 (and the component layer 104) during processing of the substrate layer 102 and the component layer 104. The acceptor wafer 106 may be removed when "topside" processing (e.g., processing involving the substrate layer 102 surface opposite the acceptor wafer 106 and the component layer 104) is partially or fully completed, for example.

In alternate implementations, the acceptor wafer 106 may be detached using a mechanical process, a chemical process, laser lift-off, a combination of these, or like process(es). In one implementation, if the substrate layer 102 and component layer 104 are not stable enough for "backside" processing (e.g., processing involving the substrate layer 102 surface formerly adjacent to the acceptor wafer 106), a support wafer, or the like, may be coupled temporarily to the component layer 104 during further processing. The insulating layer 108 may serve as an etch-stop layer resulting in a well-controlled and homogeneous adjustment of the final device thickness.

In alternate implementations there is no insulating layer 108 on the substrate layer 102.

In various implementations, the "backside" processing may include depositing and annealing backside metal (e.g., metallic layer, metallization, etc.) to the backside surface of the substrate layer 102, once the acceptor wafer 106 and insulating layer(s) 108, 110 are removed from the backside surface.

Example Implementations

FIG. 2 illustrates an example of a semiconductor arrangement 100 having a substrate layer 102 with one or more trenches 212 etched, or otherwise cut, laterally into the substrate layer 102. In the example implementation of FIG. 2, the trenches 212 may be filled, using epitaxy for example, with the material comprising the component layer 104. For example, the trenches 212 may be filled with a lightly doped p-type SiC, when a lightly doped p-type SiC is used for the component layer 104 and a heavily doped p-type SiC is used for the substrate layer 102. Alternately, both the component layer 104 and the trenches 212 may be filled with a lightly doped n-type SiC, when the substrate layer 102 is comprised of a heavily doped n-type SiC.

Figure 3:
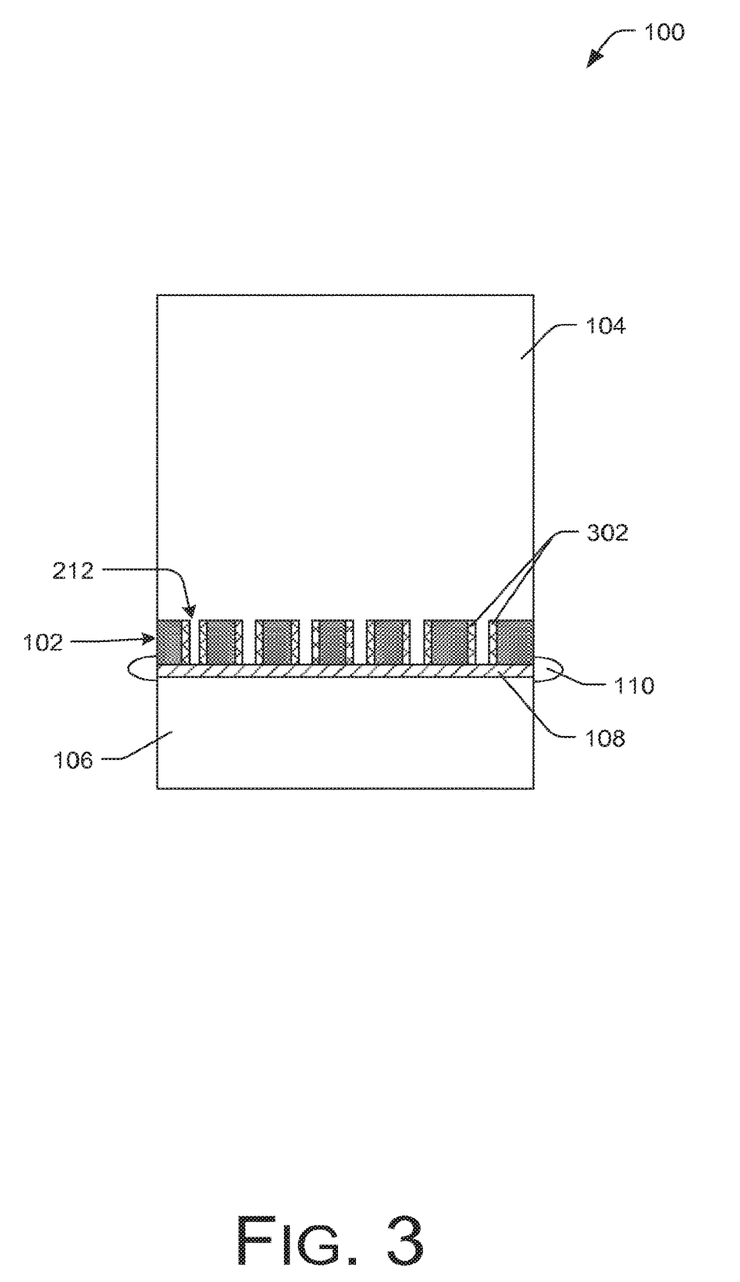
FIG. 3 is a cross-sectional profile view of an example structured starting layer, with the addition of implanted side-walls in trenches of the substrate, according to an implementation.

FIG. 3 is a cross-sectional profile view of a semiconductor arrangement 100 having a substrate layer 102 with one or more trenches 212 etched, or otherwise cut, laterally into the substrate layer 102. In various implementations, as shown in FIG. 3, the substrate layer 102 comprises one or more at least partially filled trenches 212.

In the example implementation of FIG. 3, the trench 212 walls may be lined (302), using implantation or epitaxy for example, with an n-type SiC, when a lightly doped p-type SiC is used for the component layer 104 and a heavily doped p-type SiC is used for the substrate layer 102. Alternately, the trench 212 walls may be lined, using implantation or epitaxy for example, with a p-type SiC, when the component layer 104 comprises a lightly doped n-type SiC and the substrate layer 102 comprises a heavily doped n-type SiC. In either case, the substrate layer 102 includes one or more laterally alternating doping regions (e.g., lateral n-type doping portion adjacent to lateral p-type doping portion).

Figure 4:
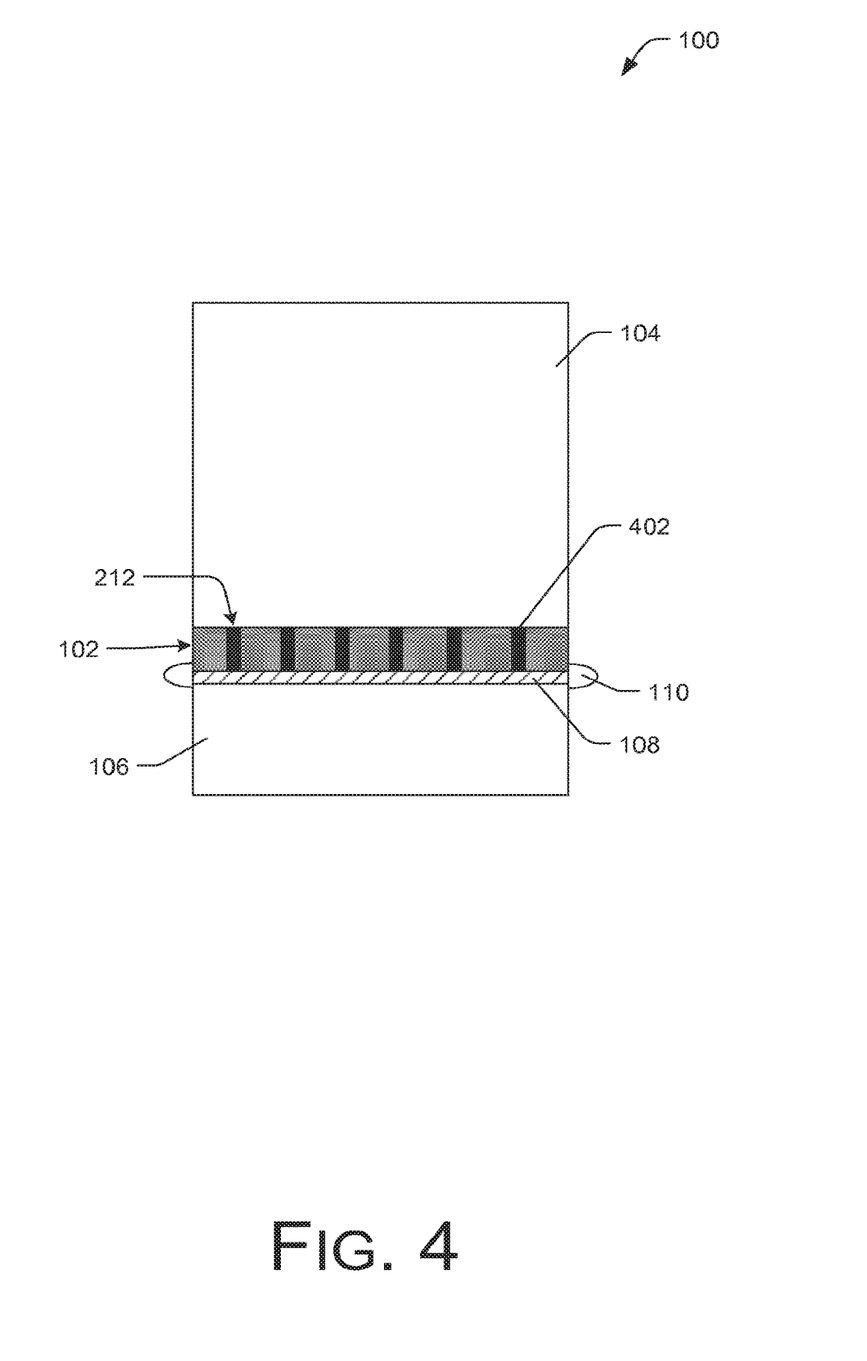
FIG. 4 is a cross-sectional profile view of an example structured starting layer, including filled implantation in trenches of the substrate, according to an implementation.

FIG. 4 is a cross-sectional profile view of a semiconductor arrangement 100 having a substrate layer 102 with one or more laterally alternating doping regions (e.g., lateral n-type doping portion adjacent to lateral p-type doping portion), according to various implementations. For example, in one implementation, the substrate layer 102 is masked and implanted to form the one or more laterally alternating doping regions. For instance, a first mask may be applied during an n-type doping implantation and a second opposite mask may be applied during a p-type doping implantation. The result of the masking and implanting can be the lateral alternating doping pattern shown in FIG. 4, by the light and dark shaded areas of the substrate layer 102.

In an alternate implementation, the substrate layer 102 may be initially doped in a uniform manner, and then one or more trenches 212 may be etched, or otherwise cut, laterally into the substrate layer 102. In the alternate implementation of FIG. 4, the trenches 212 may be filled (402), using implantation or epitaxy for example, with an n-type SiC, when a lightly doped p-type SiC is used for the component layer 104 and a heavily doped p-type SiC is used for the substrate layer 102. Alternately, the trenches 212 may be filled (402), using implantation or epitaxy for example, with a p-type SiC, when the component layer 104 comprises a lightly doped n-type SiC and the substrate layer 102 comprises a heavily doped n-type SiC. In either case, the substrate layer 102 includes one or more laterally alternating doping regions (e.g., lateral n-type doping portion adjacent to lateral p-type doping portion).

Figure 5:
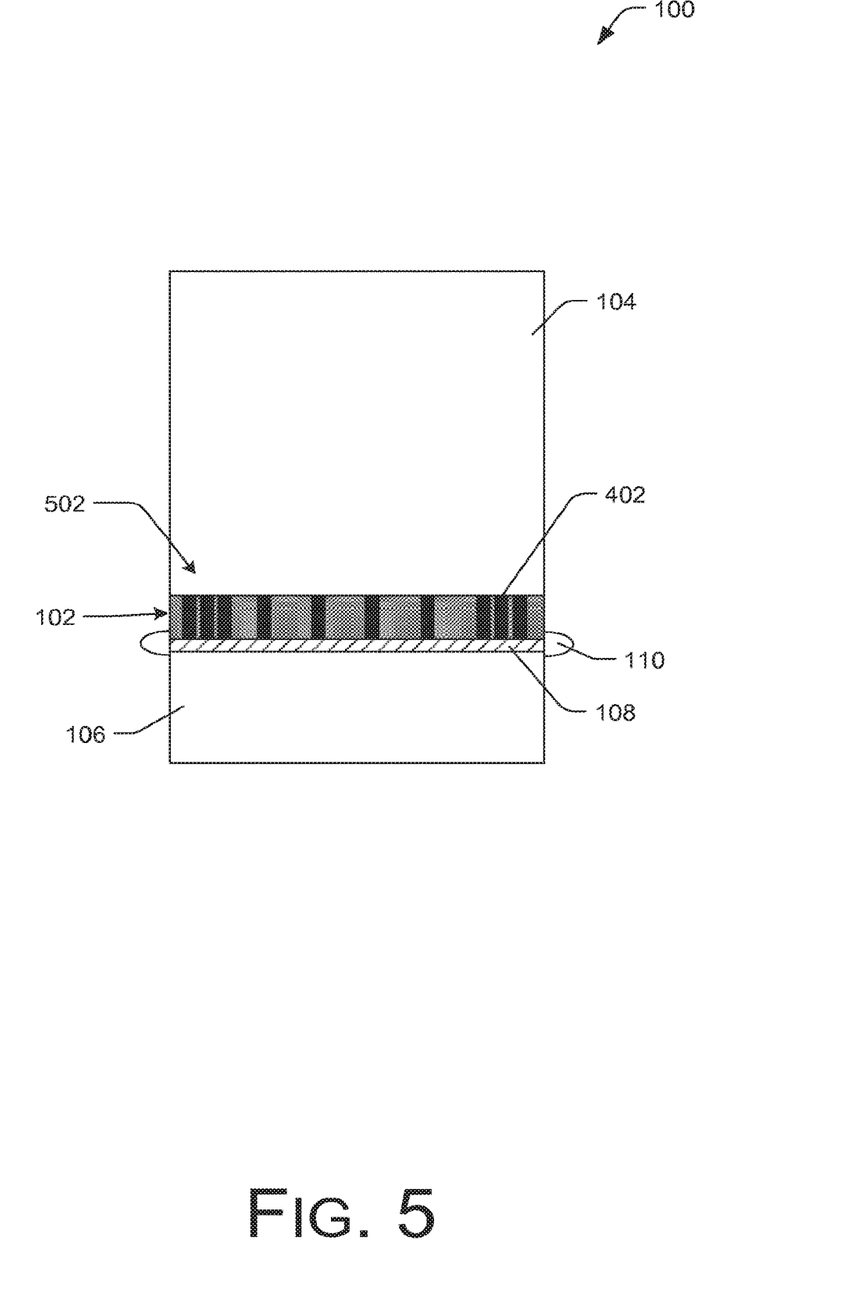
FIG. 5 is a cross-sectional profile view of an example structured starting layer, showing variations in spacing, thickness, and/or depth of implanted trenches, for example.

FIG. 5 is a cross-sectional profile view of a semiconductor arrangement 100 having a substrate layer 102 with one or more laterally alternating doping regions (e.g., lateral n-type doping portion adjacent to lateral p-type doping portion), according to the various implementations as described relative to FIG. 4. The illustration of FIG. 5 shows that the alternating doping pattern may include variations (502) in spacing and/or thickness.

For example, as shown in FIG. 5, the laterally alternating doping regions may not necessarily have regularity in spacing and thickness across the area of the substrate layer 102. Instead, the laterally alternating doping regions may be more concentrated at one or more locations, and may be less concentrated at other locations. This can be seen in FIG. 5 particularly with the darker shaded lateral portions of the substrate layer 102. Further, the thickness of a given lateral portion may be greater or lesser than the thickness of another lateral portion of the same doping type (n-type or p-type). This can be seen in FIG. 5 particularly with the lighter shaded lateral portions of the substrate layer 102.

In various implementations, the laterally alternating doping regions of the substrate layer 102 may allow for the production of desired semiconductor devices, such as but not limited to power MOSFETs, bipolar diodes, Schottky diodes, IGBTs, and the like. Further, variations in the spacing and/or thickness of the laterally alternating doping regions may allow for designing the emitter efficiency of SiC-based IGBT devices and diodes and/or including design techniques that reduce injection of free carriers in the edge termination region of the chip or in the area of the gate pad or gate feeders by a reduction of the effective backside emitter area. Additionally, variations in the spacing and/or thickness of the laterally alternating doping regions may allow for variations in the lateral direction of injection of holes with IGBTs or variations in the lateral direction of injection of electrons from the wafer back side to realize fast switching diodes.

Different configurations for an arrangement 100, including a substrate layer 102 may be possible with different implementations. In alternate implementations, various other combinations and designs of the arrangement 100 and/or the substrate layer 102 are also within the scope of the disclosure. The variations may have fewer elements than illustrated in the examples shown in FIGS. 1-5, or they may have more or alternative elements than those shown.

Representative Process

Figure 6:
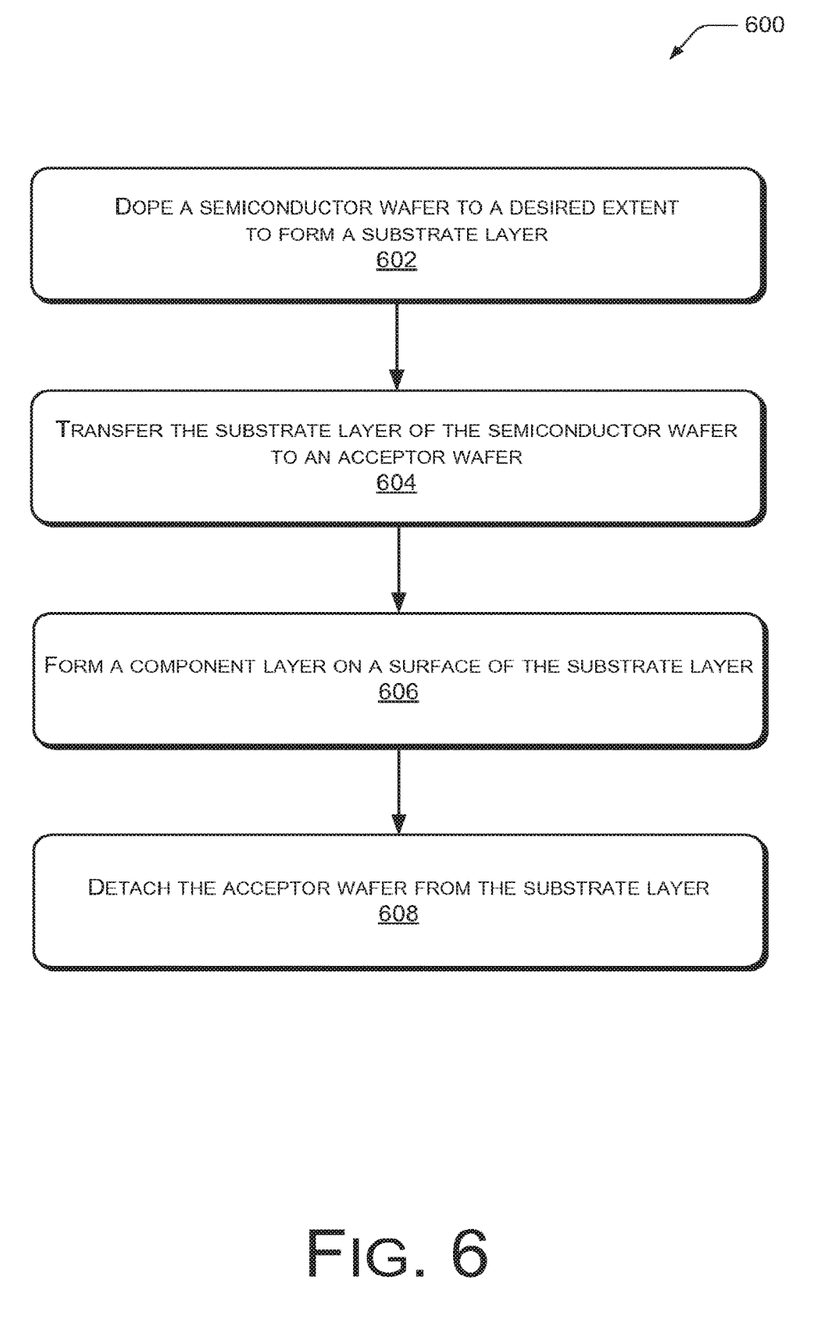
FIG. 6 is a flow diagram illustrating an example process for producing an optimized layer for a semiconductor, according to an implementation.

FIG. 6 illustrates a representative process 600 for producing an optimized substrate layer (such as substrate layer 102, for example) for a semiconductor component, such as a silicon carbide (SiC) semiconductor component, for example, according to various implementations. In an implementation, the optimized substrate layer is cut from a bulk wafer and bonded to a handle wafer (such as acceptor wafer 106, for example). In various implementations, one or more doping properties or characteristics are tuned to optimize the substrate layer for forming the desired semiconductor component. The process 600 is described with reference to FIGS. 1-5.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 602, the process includes doping a semiconductor wafer to a desired extent to form a substrate layer (such as substrate layer 102, for example). In an implementation, the process includes heavily doping the semiconductor wafer with n-type or p-type dopant to form the substrate layer. In various implementations, the semiconductor wafer is comprised of SiC.

In various implementations, one or more doping properties or characteristics of the substrate layer are tuned to optimize the substrate layer as an individualized starting layer for a semiconductor device to be formed on it. In one implementation, the process includes doping the semiconductor wafer substantially uniformly over an area of the semiconductor wafer. In other words, the area of the semiconductor wafer is homogeneously doped to a desired density. In one example, the area of the semiconductor wafer is homogeneously doped at a concentration at or greater than $10^{20}$ cm$^3$.

In another implementation, the process includes doping the semiconductor wafer in alternating portions of n-type and p-type doping, to form the substrate layer. For example, in one implementation, the process includes doping the semiconductor wafer using a masked implantation to form a doped pattern over the area of the semiconductor wafer. In the implementation, the masked implantation creates the alternating doping pattern.

In another implementation the process includes using a trench-fill epitaxy or implantation process to form the substrate layer. For example, one or more trenches may be etched or otherwise cut into the area of the semiconductor wafer (e.g., or into the substrate layer). In an implementation, the trenches are arranged laterally along the area of the semiconductor wafer. In various implementations, the trenches may be partially or fully filled, by implantation, epitaxy, or the like, with a doping that is the opposite type of doping as the doped portion of the semiconductor wafer or substrate layer that the trenches are cut into. In the implementations, the partially or fully filled trenches create the alternating doping pattern.

At block 604, the process includes transferring the substrate layer of the semiconductor wafer to an acceptor wafer (such as acceptor wafer 106, for example). In an implementation, the process includes implanting the semiconductor wafer with hydrogen ions to a desired depth and cutting the substrate layer from the semiconductor wafer at the desired depth to determine a thickness of the substrate layer. In the implementation, the cut substrate layer is transferred to the acceptor wafer. In one example, the process includes bonding the substrate layer to the acceptor wafer using an oxidic bonding process, for example.

In various implementations, the acceptor wafer is comprised of a material that is compatible with an epitaxial process performed on the substrate layer. In some implementations, the acceptor wafer is comprised of a polysilicon carbide, tungsten, SiC coated carbon, or like material.

In an implementation, the process includes forming an insulating layer on a surface of the substrate layer prior to transferring the substrate layer to the acceptor wafer. The insulating layer may include an oxide, such as silicon dioxide, or the like. In another implementation, the process includes forming a protection layer over the insulating layer (e.g., such as when an oxide material is used for the insulating layer). In the implementation, the protection layer prevents the insulating layer from dissolving in the atmosphere of the epitaxial process.

At block 606, the process includes forming a component layer (such as component layer 104, for example) on a surface of the substrate layer. For example, the component layer may be formed on the surface of the substrate layer that is opposite the acceptor wafer. In an implementation, the process includes forming the component layer using a lighter doping density than a doping density of the substrate layer. In another implementation, the process includes forming the component layer such that it is thicker than the substrate layer and/or such that it has a greater impedance than the substrate layer.

In alternate implementations, the component layer may be formed on a surface of the substrate layer prior to transferring the substrate layer to the acceptor wafer, or after transferring the substrate layer to the acceptor wafer.

In an implementation, the component layer is formed by epitaxy on the surface of the substrate layer. In a further implementation, the component layer is comprised of SiC, or the like material. In various implementations, the component layer is implanted, etched, filled, metallized, and/or the like, to form a desired semiconductor device or component.

At block 608, the process includes detaching the acceptor wafer from the substrate layer. In various implementations, the acceptor wafer is detached from the substrate layer after processing the component layer. For example, the acceptor wafer may be detached from the substrate layer using mechanical, chemical, laser lift-off, or other techniques. In one implementation, the process includes removing the insulating layer in addition to the acceptor wafer from the substrate layer and doping an exposed surface of the substrate layer.

In an implementation, if the substrate layer with the component layer are mechanically instable after removing the acceptor wafer, the process includes coupling a stabilizing layer to an exposed surface of the component layer during processing of the opposite (e.g., exposed underside) surface of the substrate layer, and removing the stabilizing layer after processing.

In various implementations, the process includes applying (e.g., depositing, etc.) and annealing a metallization layer to a surface of the substrate layer that is exposed by detaching the acceptor wafer from the substrate layer. In other implementations, other processes may be performed with regard to the exposed underside (i.e., backside) surface of the substrate layer, such as implanting, etching, filling, and the like.

In alternate implementations, other techniques may be included in the process 600 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A semiconductor component, comprising:
   a doped substrate layer cut from an initial wafer, the doped substrate layer forming a drain region, a rear-side contact zone, or an emitter of the semiconductor component;
   a second layer grown directly on a first surface of the doped substrate layer, the second layer having a greater thickness than the doped substrate layer and a lesser doping density than the doped substrate layer; and
   a metallic layer in direct contact with a second surface of the doped substrate layer opposite the first surface,
   wherein the semiconductor component, the doped substrate layer and the second layer are each based on silicon carbide,
   wherein the semiconductor component further comprises one or more trenches formed in the doped substrate layer,
   wherein the doped substrate layer comprises p-type or n-type SiC,
   wherein sidewalls of the one or more trenches are lined with SiC having an opposite doping type as the doped substrate layer,
   wherein the one or more trenches is filled with a material of the second layer between the respective SiC lined sidewalls of the one or more trenches.

2. The semiconductor component of claim 1, wherein the thickness of the doped substrate layer is in a range of 5 µm to 20 µm and the thickness of the second layer is in a range of 20 µm to 200 µm.

3. The semiconductor component of claim 1, wherein the doping density of the doped substrate layer is in a range of $10^{18}/cm^3$ to $10^{20}/cm^3$ and the doping density of the second layer is in a range of $10^{14}/cm^3$ to $10^{17}/cm^3$.

4. The semiconductor component of claim 1, wherein the doped substrate layer comprises a plurality of laterally oriented portions having alternate n-type and p-type doping.

5. The semiconductor component of claim 4, wherein the plurality of laterally oriented portions has nonuniform spacing and/or thickness.

6. The semiconductor component of claim 1, wherein the doped substrate layer comprises heavily doped p-type SiC, the second layer comprises lightly doped p-type SiC and the one or more trenches is filled with lightly doped p-type SiC between the respective SiC lined sidewalls of the one or more trenches, or wherein the doped substrate layer comprises heavily doped n-type SiC, the second layer comprises lightly doped n-type SiC and the one or more trenches is filled with lightly doped n-type SiC between the respective SiC lined sidewalls of the one or more trenches.

7. A method of manufacturing a semiconductor component, comprising:
   forming a doped substrate layer in a semiconductor wafer, the doped substrate layer forming a drain region, a rear-side contact zone, or an emitter of the semiconductor component;
   transferring the doped substrate layer of the semiconductor wafer to an acceptor wafer by an ion implantation process which comprises cutting the doped substrate layer from the semiconductor wafer and bonding the doped substrate layer to the acceptor wafer;
   forming a component layer of the semiconductor component on a surface of the doped substrate layer facing away from the acceptor wafer, the component layer having a greater thickness than the doped substrate layer and a lesser doping density than the doped substrate layer;
   detaching the acceptor wafer from the doped substrate layer after the component layer is formed; and
   applying and annealing a metallization layer directly to a surface of the doped substrate layer that is exposed by detaching the acceptor wafer from the substrate layer,
   wherein the semiconductor component and the doped substrate layer are both based on silicon carbide, wherein the semiconductor component further comprises one or more trenches formed in the doped substrate layer, wherein the method further comprises:

implanting sidewalls of the one or more trenches with a doping that is an opposite doping type as the doped substrate layer; and filling the one or more trenches with a material of the component layer between the respective doped sidewalls of the one or more trenches.

8. The method of claim 7, further comprising forming an insulating layer on a surface of the doped substrate layer to which the acceptor wafer is to be attached prior to transferring the doped substrate layer to the acceptor wafer.

9. The method of claim 8, further comprising removing the insulating layer in addition to the acceptor wafer from the doped substrate layer and doping an exposed surface of the doped substrate layer.

10. The method of claim 7, further comprising forming a plurality of laterally oriented portions in the doped substrate layer and which have alternate n-type and p-type doping.

11. The method of claim 10, further comprising varying the spacing and/or thickness of the plurality of laterally oriented portions in the doped substrate layer.

* * * * *